(12) United States Patent
Oki et al.

(10) Patent No.: US 11,985,787 B2
(45) Date of Patent: May 14, 2024

(54) ADAPTER MOUNTING STRUCTURE

(71) Applicants: JAPAN COMMUNICATION ACCESSORIES MANUFACTURING CO., LTD., Komaki (JP); SUMITOMO ELECTRIC INDUSTRIES, LTD., Osaka (JP)

(72) Inventors: Eisuke Oki, Komaki (JP); Shinsuke Sato, Komaki (JP); Takahiro Nakada, Komaki (JP); Nghia Duong Tuan, Komaki (JP); Takayuki Yokochi, Osaka (JP)

(73) Assignees: JAPAN COMMUNICATION ACCESSORIES MANUFACTURING CO., LTD., Komaki (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 482 days.

(21) Appl. No.: 17/281,020

(22) PCT Filed: Oct. 23, 2019

(86) PCT No.: PCT/JP2019/041565
§ 371 (c)(1),
(2) Date: Mar. 29, 2021

(87) PCT Pub. No.: WO2020/085395
PCT Pub. Date: Apr. 30, 2020

(65) Prior Publication Data
US 2021/0345513 A1 Nov. 4, 2021

(30) Foreign Application Priority Data
Oct. 23, 2018 (JP) .................... 2018-199436

(51) Int. Cl.
*H05K 7/00* (2006.01)
*G02B 6/38* (2006.01)
(Continued)

(52) U.S. Cl.
CPC ......... *H05K 7/1491* (2013.01); *G02B 6/3897* (2013.01); *G02B 6/4441* (2013.01); *G02B 6/4453* (2013.01); *H05K 7/1487* (2013.01)

(58) Field of Classification Search
None
See application file for complete search history.

(56) References Cited

U.S. PATENT DOCUMENTS 9,482,385 B2 * 11/2016 Braucht ............... F16M 13/022
2009/0269019 A1 10/2009 Andrus et al.
(Continued)

FOREIGN PATENT DOCUMENTS

CN 207336837 U 5/2018
JP 2003-029055 A 1/2003
(Continued)

*Primary Examiner* — Imani N Hayman
*Assistant Examiner* — Rashen E Morrison
(74) *Attorney, Agent, or Firm* — Oliff PLC

(57) ABSTRACT

An adapter mounting structure for mounting, on a rack, a plurality of adapters to which optical connectors are connected. The adapter mounting structure includes a first panel including insertion holes through which the plurality of adapters are inserted, the first panel being configured to expose, to a front side of the rack, the plurality of adapters thus inserted and being anchored to the rack, and a second panel disposed to a rear side of the rack relative to the first panel, the second panel being anchored to the first panel and being configured to anchor each of the plurality of adapters.

20 Claims, 10 Drawing Sheets

(51) Int. Cl.
G02B 6/44 (2006.01)
H05K 7/14 (2006.01)

(56) References Cited

U.S. PATENT DOCUMENTS

2014/0037259 A1* 2/2014 Bragg ................ G02B 6/44526
361/627
2018/0252889 A1* 9/2018 Wakileh ............... G02B 6/4471

FOREIGN PATENT DOCUMENTS

| JP | 2009-229997 A | 10/2009 |
| JP | 2009-294531 A | 12/2009 |

* cited by examiner

ADAPTER MOUNTING STRUCTURE

TECHNICAL FIELD

An aspect of the disclosure relates to an adapter mounting structure.

This application claims the priority based on Japanese Patent Application No. 2018-199436 filed on Oct. 23, 2018, which is hereby incorporated by reference in its entirety.

BACKGROUND ART

Patent Literature 1 discloses an adapter panel mounting structure in which a plurality of optical adapters for connecting optical cords are mounted. In the adapter panel mounting structure, two adapter panels arranged side by side are each mounted on a front end of a chassis. The adapter panels have a plate shape extending along a front panel of the chassis. The adapter panels each include a latch that fits into a mounting hole formed in the front panel of the chassis, and a claw-shaped protrusion to be engaged with a locking member located at a center of the front panel in the left-right direction. Fitting the latch into the mounting hole and causing the claw-shaped protrusion to engage with the locking member causes the adapter panel to be mounted on the chassis. The latch is provided at one end of each adapter panel in the left-right direction, and the claw-shaped protrusion is provided at the other end of the adapter panel in the left-right direction.

Patent Literature 2 discloses an optical connector connection panel. The optical connector connection panel is mounted on a plurality of mount angles (supports) arranged vertically inside a rack. The optical connector connection panel includes a panel body having a rectangular box shape. An adapter panel to which a plurality of optical adapters are anchored is mounted on a front surface of the panel body. In the adapter panel, the plurality of optical adapters are arranged in a grid pattern, and the adapter panel has a rectangular shape extending horizontally.

CITATION LIST

Patent Literature

Patent Literature 1: Japanese Unexamined Patent Publication No. 2009-294531
Patent Literature 2: Japanese Unexamined Patent Publication No. 2003-29055

SUMMARY OF INVENTION

An adapter mounting structure according to an aspect of the present disclosure is an adapter mounting structure for mounting, on a rack, a plurality of adapters to which optical connectors are connected. The adapter mounting structure includes a first panel configured to expose, to a front side of the rack, the plurality of adapters and anchored to the rack, and a second panel disposed to a rear side of the rack relative to the first panel, the second panel being anchored to the first panel and being configured to anchor each of the plurality of adapters.

DESCRIPTION OF EMBODIMENTS

Figure 1:
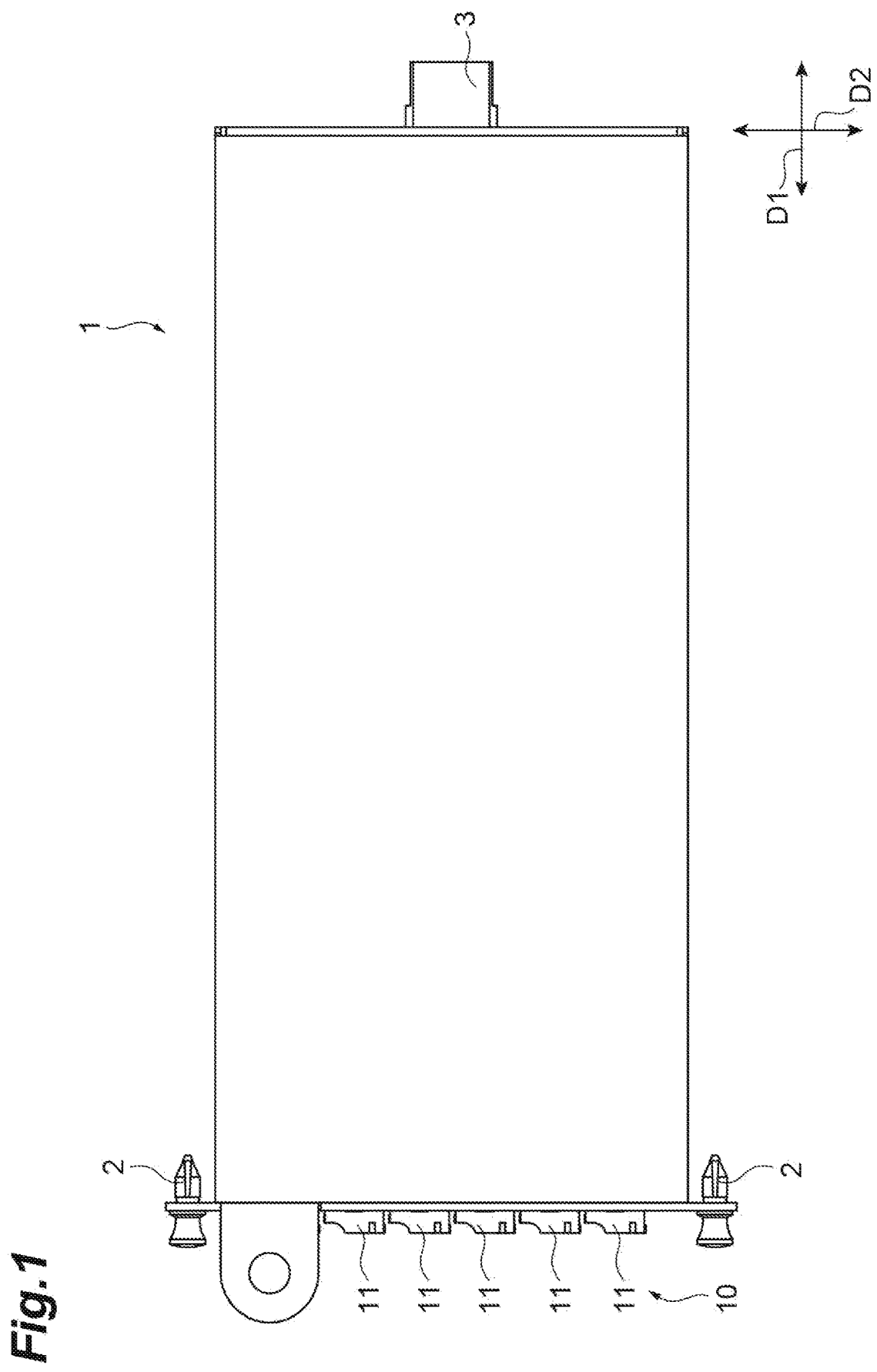
FIG. 1 is a diagram showing an example of a module including an adapter mounting structure according to the first embodiment.

Each of the above-described adapter panels has a plate shape, and a plurality of adapters are mounted on the adapter panel having a plate shape. An optical connector is connected to each of the plurality of adapters. When an adapter panel has a plate shape, there is a concern that the adapter panel may bend due to the connection of the optical connector to the adapter. In particular, when the number of adapters mounted on the adapter panel is large, and a plurality of adapters are highly densely arranged on the adapter panel, there is a concern that the adapter panel may be deformed when, for example, the optical connector is connected to the adapter.

In each of the above-described adapter panels, a plurality of adapters protrude from the adapter panel. When the number of adapters mounted on the adapter panel is large, the adapter panel may be provided with identification numbers for use in identifying each of the plurality of adapters. At this time, when the protrusion amount of the adapters from the adapter panel is large, there is a concern that the above-described identification numbers may be difficult to see due to the protrusion of the adapters. Therefore, it is required to suppress deformation in the adapter panel and to reduce the protrusion amount of the adapters.

One aspect of the present disclosure is to provide an adapter mounting structure that can suppress deformation and reduce the protrusion amount of the adapter.

According to the present disclosure, it is possible to suppress deformation and reduce the protrusion amount of the adapters.

First, descriptions will be given in series of the contents of embodiments of the present disclosure. An adapter mounting structure according to an embodiment is an adapter mounting structure for mounting, on a rack, a plurality of adapters to which optical connectors are connected. The adapter mounting structure includes a first panel including insertion holes through which a plurality of adapters are inserted, the first panel being configured to expose, to a front side of the rack, the plurality of adapters thus inserted and being anchored to the rack, and a second panel disposed to the rear side of the rack relative to the first panel, the second panel being anchored to the first panel and being configured to anchor each of the plurality of adapters.

The adapter mounting structure according to the embodiment includes the first panel anchored to the rack and configured to expose the adapters, and the second panel anchored to the first panel and configured to anchor the adapters. The adapter mounting structure includes the first panel located adjacent to the front side of the rack and the second panel located adjacent to the rear side of the rack, and each of the plurality of adapters is mounted on the two panels integrated into a single panel. Therefore, the use of such two panels makes it possible to increase strength and in turn makes it possible to suppress deformation in the panels. Each of the plurality of adapters is exposed from the first panel to the front side of the rack and is anchored to the second panel located adjacent to the rear side of the rack relative to the first panel. Anchoring each adapter to the second panel located adjacent to the rear side of the rack makes it possible to reduce the protrusion amount of the adapters from the first panel. For example, even when the adapter mounting structure has an identification number for use in identifying each adapter, the reduction in the protrusion amount of the adapters makes the identification number clearly visible.

In the adapter mounting structure according to the embodiment, the first panel may include a first bent portion bent toward the rear side of the rack. This structure where the first panel includes the first bent portion bent toward the rear side of the rack can increase strength of the first panel. It is therefore possible to more reliably suppress deformation in the first panel caused by the connection of the optical connectors to the adapters or the like.

In the adapter mounting structure according to the embodiment, the second panel may include a second bent portion bent along the first bent portion. This structure where the second panel configured to anchor the plurality of adapters include the second bent portion can increase strength of the second panel. It is therefore possible to more reliably suppress deformation in the second panel caused by the application of an external force to the adapters.

In the adapter mounting structure according to the embodiment, the first panel may include a front surface portion configured to expose the adapters. The first bent portion may include a pair of first side surface portions extending from both ends of the front surface portion in the left-right direction toward the rear side of the rack, and a bottom surface portion extending from a lower end of the front surface portion toward the rear side of the rack. This structure where the first bent portion includes the pair of the first side surface portions and the bottom surface portion can further increase the strength of the first panel. This in turn makes it possible to more reliably suppress deformation in the first panel.

In the adapter mounting structure according to the embodiment, the first bent portion may further include a pair of second side surface portions extending upward from both ends of the bottom surface portion in the left-right direction. This structure where the first bent portion further includes the second side surface portions can more reliably suppress deformation caused by the connection of the optical connectors or the like.

In the adapter mounting structure according to the embodiment, the first side surface portions and the second side surface portions may be each screwed to the second panel. This structure where the first side surface portions and second side surface portions of the first panel are each screwed to the second panel allows the first panel and the second panel to be anchored to each other more tightly, and can reduce the need of sheet-metal welding or the like between the first panel and the second panel and the like. It is therefore possible to reduce the cost of sheet-metal welding or the like and to enhance finished appearances of the first panel and the second panel.

Details of Embodiments

A description will be given of specific examples of the adapter mounting structure according to the embodiments of the present disclosure with reference to the drawings. It should be noted that the present disclosure is not limited to the following specific examples, and is intended to be defined by the claims and to include all modifications within the scope of the claims and their equivalents. In the following description, the same or equivalent components are denoted by the same reference numerals, and any redundant description will be omitted as appropriate.

First Embodiment

Figure 2:
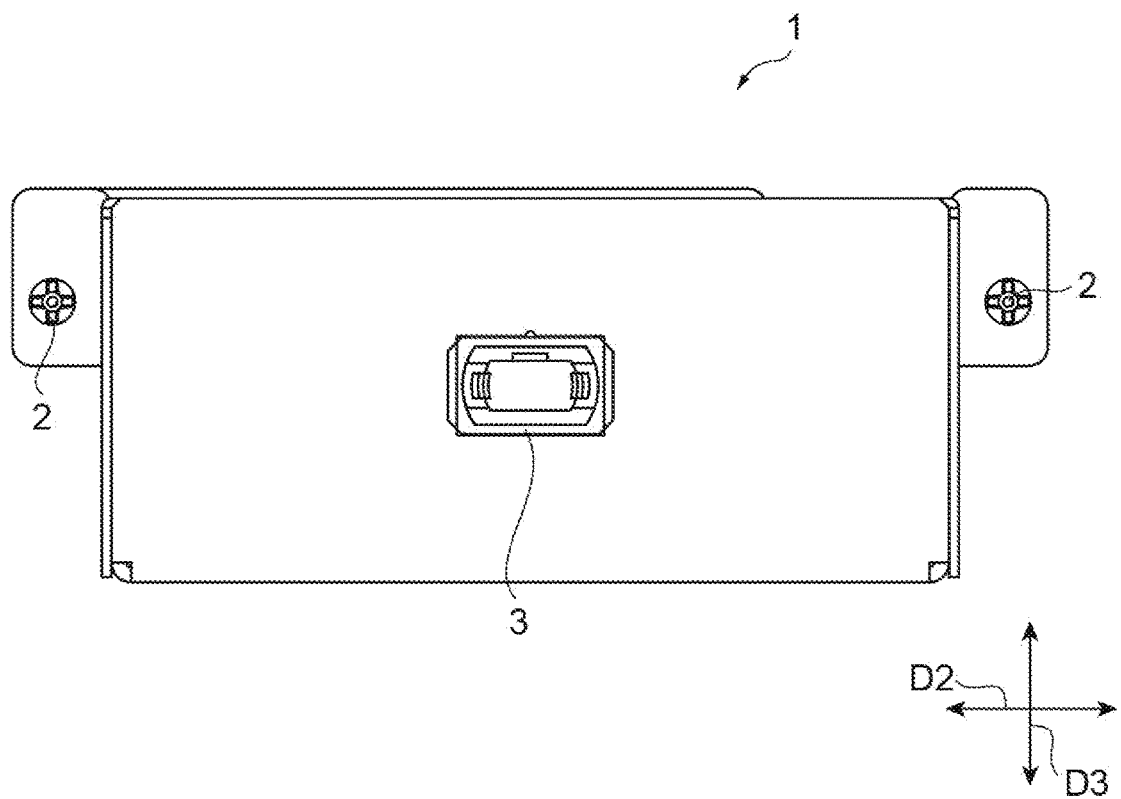
FIG. 2 is a rear view of the module shown in FIG. 1.

FIG. 1 is a plan view of an exemplary module 1 including an adapter mounting structure 10 according to the first embodiment. FIG. 2 is a side view showing a side of the module 1 remote from the adapter mounting structure 10. The adapter mounting structure 10 is a structure for mounting, on a rack, a plurality of adapters 11 to which optical connectors are connected, by which the plurality of adapters 11 are held in an exposed state. As an example, the module 1 is a cassette-type device to be mounted on a rack in a data center and serves as an optical wiring module of the rack. The module 1 has a rectangular box shape extending in a first direction D1 corresponding to the longitudinal direction, a second direction D2 corresponding to the width direction, and a third direction D3 corresponding to the height direction.

The adapter mounting structure 10 is provided at one end of the module 1 in the first direction D1. An adapter 3 is provided at the other end of the module 1 in the first direction D1. The adapter 3 is, for example, an MPO adapter to which an MPO connector is connected. In this case, the module 1 may be an MPO cassette that allows a plug-and-play connection between the MPO connector and each single-core connector. For example, a plurality of optical waveguide members (such as optical cables) are laid inside the module 1. A multi-core MPO connector connected to the adapter 3 is optically connected to each of the plurality of optical waveguide members.

Each of the plurality of optical waveguide members is optically connected to an optical connector connected to a corresponding one of the plurality of adapters 11. As an example, a 24-core MPO connector is connected to the adapter 3. For example, 24 optical cables are laid inside the module 1, and each of the 24 optical cables is optically connected to an optical connector connected to a corresponding one of 24 adapters 11. In the adapter mounting structure 10, for example, the adapters 11 provided for 24 optical connectors are arranged in a grid pattern. For example, the 24 adapters 11 include 12 pairs of adapters in total arranged in two rows (two rows of six pairs), each pair corresponding to two optical connectors (double optical connector), and each row including six pairs of adapters. For example, each pair of adapters 11 is a double LC adapter, and the optical connector connected to each adapter 11 is an LC connector. In this case, the module 1 is an MPO cassette module in which each single-core LC connector and the multi-core MPO connector are optically connected to each other.

For example, the module 1 is mounted on each of a plurality of chassis to be attached to and detached from the rack, and includes a nylatch 2 to be fitted to the chassis. Note that the module 1 may be mounted on the rack via a member (for example, an MPO cassette base) other than such a chassis. The nylatch 2 is provided at both ends of the adapter mounting structure 10 in the second direction D2, for example.

Figure 3:
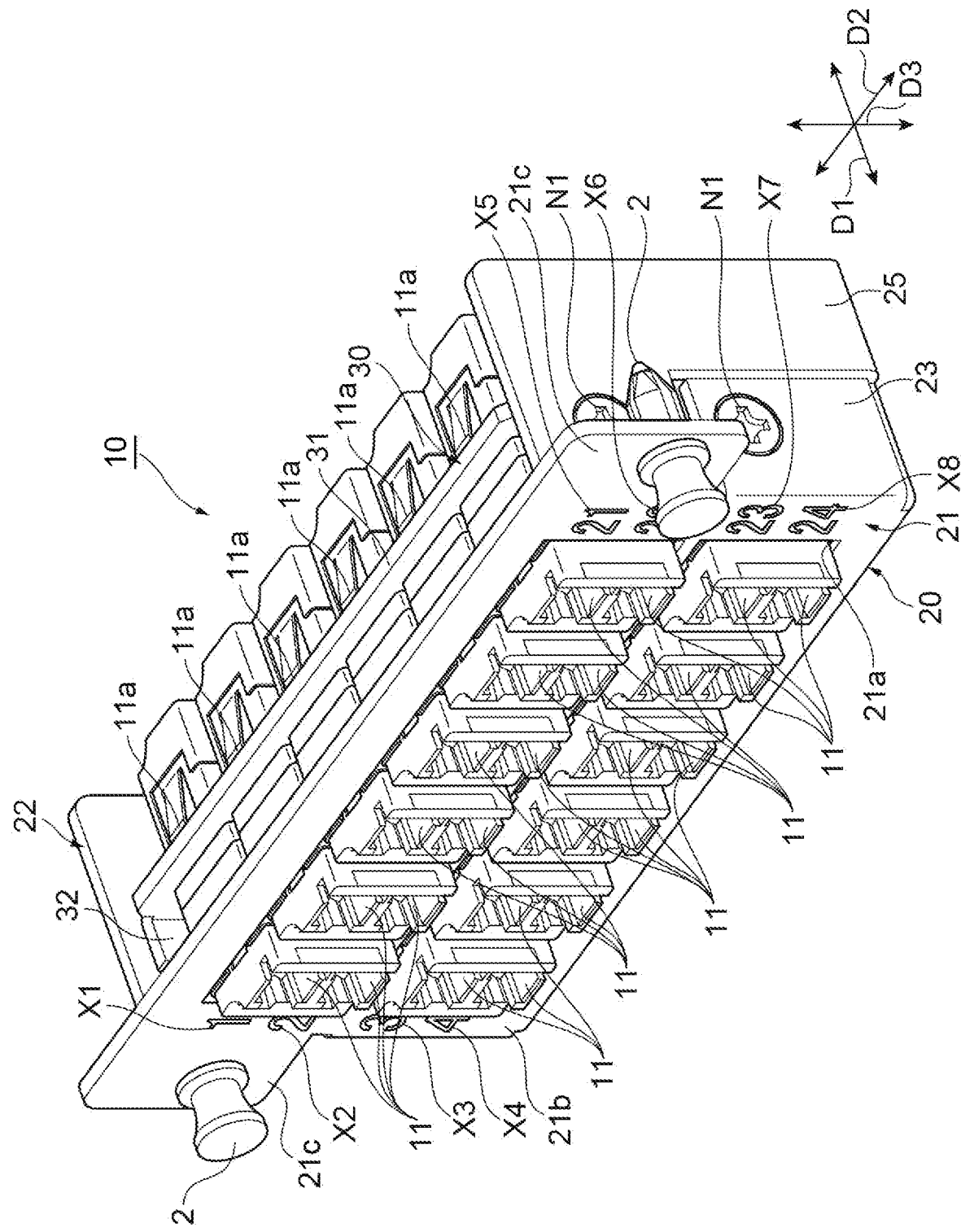
FIG. 3 is a perspective view of the adapter mounting structure shown in FIG. 1.
Figure 4:
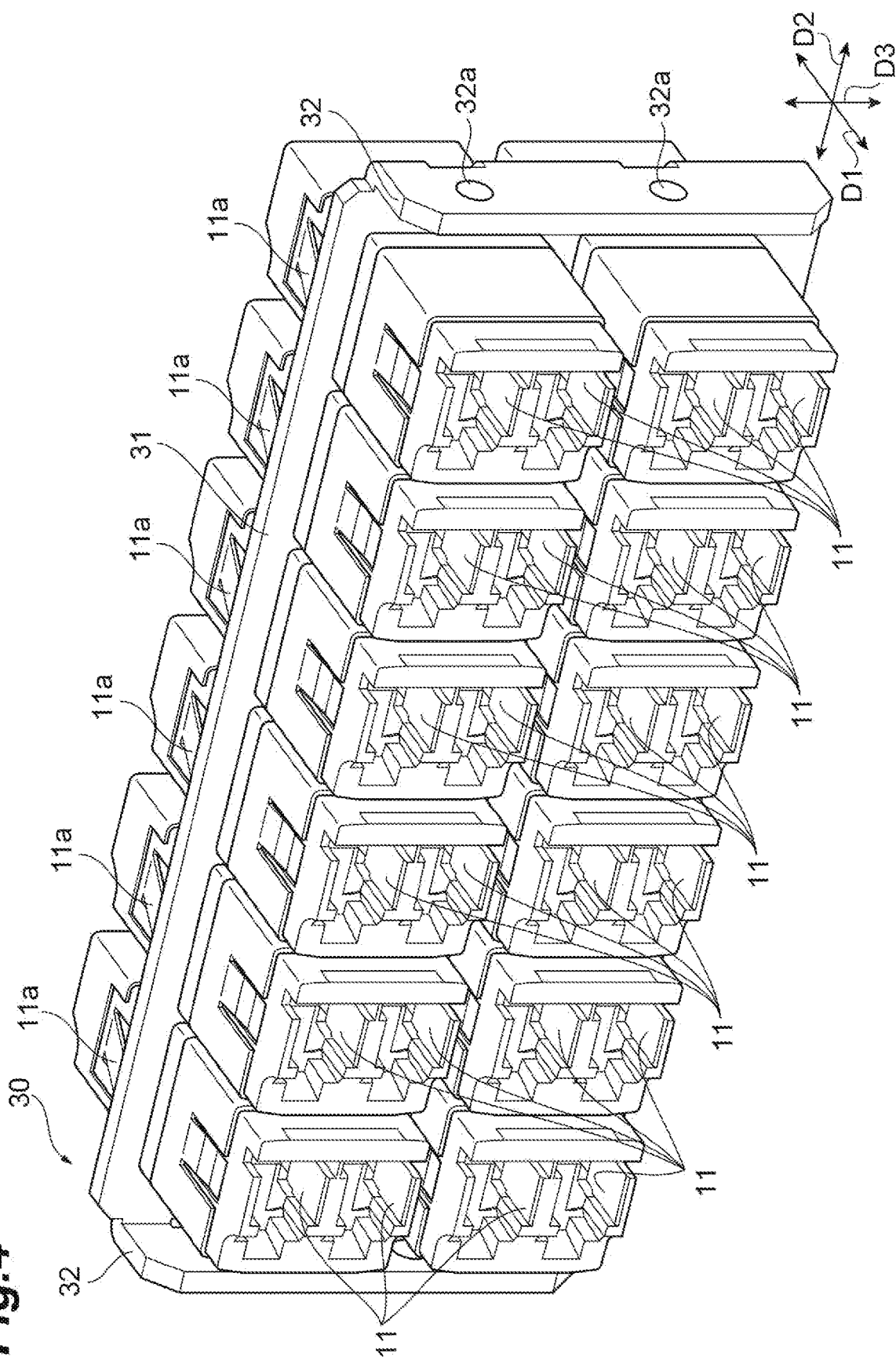
FIG. 4 is a perspective view of the adapter mounting structure shown in FIG. 3 with a first panel removed.

FIG. 3 is a perspective view of the adapter mounting structure 10. FIG. 4 is a perspective view of the adapter mounting structure 10 with the first panel 20 removed. As shown in FIGS. 3 and 4, the adapter mounting structure 10 includes the first panel 20 anchored to the rack and exposed to the front side of the rack, and the second panel 30 located to the rear side of the rack.

As shown in FIG. 3, the first panel 20 is disposed to the front side of the rack relative to the second panel 30 and exposes the plurality of adapters 11 to the front side of the rack. Herein, the "front side" corresponds to one side in the first direction D1 (diagonally downward to the left in FIG. 3) and indicates a direction toward the outside of the rack when the adapter mounting structure 10 is mounted on the rack. The "rear side" corresponds to the other side in the first direction D1 (diagonally upward to the right in FIG. 3) and indicates a direction toward the inside of the rack when the adapter mounting structure 10 is mounted on the rack.

The first panel 20 includes a front surface portion 21 that has a rectangular shape and exposes the adapters 11 and a first bent portion 22 bent toward the rear side of the rack. The front surface portion 21 includes, for example, a main body portion 21b having insertion holes 21a that extend in the second direction D2 and expose the plurality of adapters 11, and a pair of protruding portions 21c extending outward from the main body portion 21b in the second direction D2. The above-described nylatch 2 is inserted into the first panel 20 in the first direction D1, specifically, the nylatch 2 penetrates each protruding portion 21c of the front surface portion 21 in the first direction D1.

On the front surface portion 21, the plurality of adapters 11 are arranged in, for example, a grid pattern in both the second direction D2 and the third direction D3. On the front surface portion 21, for example, identification numbers X1, X2, X3, X4, X5, X6, X7, X8 for use in identifying each of the plurality of adapters 11 are printed. As an example, the identification number X1 denotes "1", the identification number X2 denotes "2", the identification number X3 denotes "3", the identification number X4 denotes "4", the identification number X5 denotes "21", and the identification number X6 denotes "22", the identification number X7 denotes "23", and the identification number X8 denotes "24".

This allows each adapter 11 to be identified as follows, for example: an adapter 11 at the first place from both the left and top is identified as "1", an adapter 11 at the first place from the right and the fourth place from the top is identified as "24", and an adapter 11 at the third place from the left and the second place from the top is identified as "10". Note that the mode of the identification numbers of the adapter mounting structure is not limited to the identification numbers X1 to X8 shown on the front surface portion 21 and can be changed as appropriate.

The first panel 20 includes the first bent portion 22 bent in the first direction D1. For example, the first bent portion 22 is bent from the main body portion 21b in the first direction D1. Accordingly, the first bent portion 22 is located inside the adapter mounting structure 10 in the second direction D2 relative to the protruding portions 21c. Note that the details of the first bent portion 22 will be described later.

The second panel 30 is placed in, for example, a space defined by the front surface portion 21 and each first bent portion 22 of the first panel 20. The first panel 20 and the second panel 30 are anchored to each other with a plurality of screws N1. The second panel 30 anchors each of the plurality of adapters 11. A leaf spring 11a is provided on each adapter 11. When each adapter 11 is pressed against the second panel 30, the leaf spring 11a is expanded upward to be caught on the second panel 30. As a result, each adapter 11 is anchored to the second panel 30. A portion of each adapter 11 anchored to the adapter mounting structure 10 is provided to the rear side of the rack relative to the first panel 20.

As shown in FIGS. 3 and 4, the second panel 30 includes a main body portion 31 to which each adapter 11 is anchored, and a second bent portion 32 bent in the first direction D1 from both ends of the main body portion 31 in the second direction D2. The second bent portion 32 is a portion bent along the first bent portion 22 of the first panel 20, specifically a portion bent in a direction opposite to the direction in which the first bent portion 22 extends (toward the front side of the rack). The second bent portion 32 is located inside the adapter mounting structure 10 in the second direction D2 relative to the first bent portion 22. The second bent portion 32 includes a screw hole 32a into which the screw N1 penetrating the first bent portion 22 is inserted. The second bent portion 32 includes, for example, a pair of the screw holes 32a aligned in the third direction D3.

Figure 5:
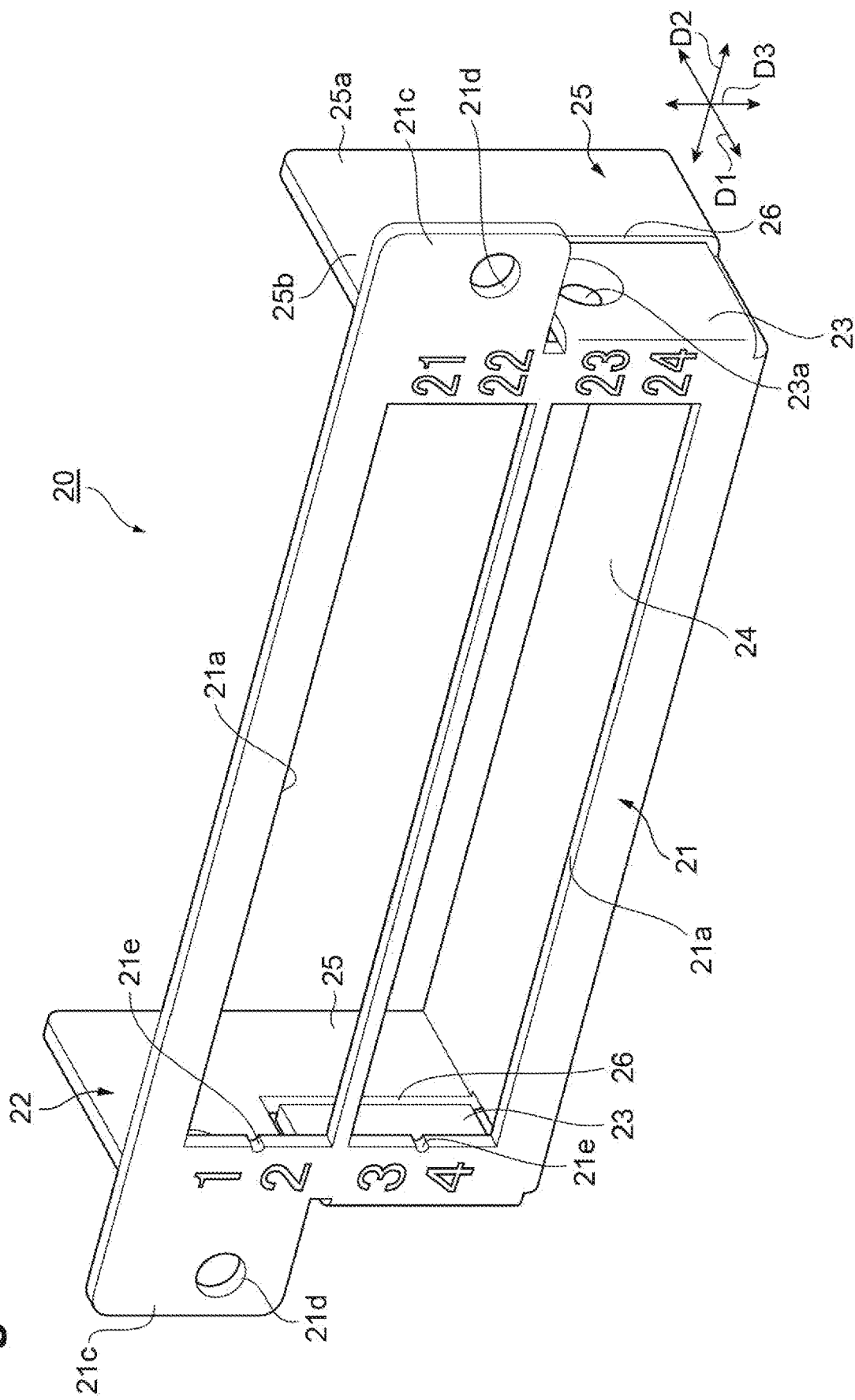
FIG. 5 is a perspective view of the first panel of the adapter mounting structure shown in FIG. 3.
Figure 6:
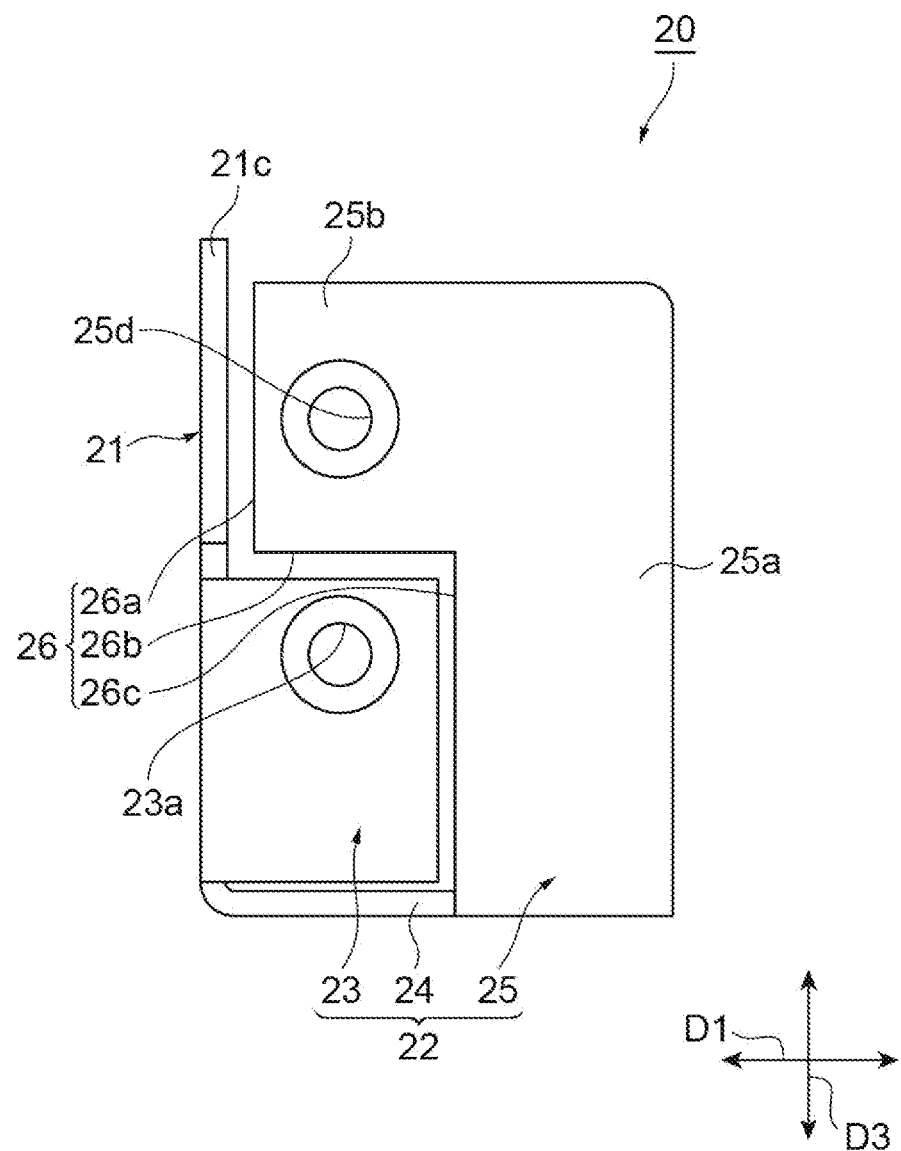
FIG. 6 is a side view of the first panel shown in FIG. 5.

FIG. 5 is a perspective view of the first panel 20. FIG. 6 is a side view of the first panel 20 as viewed in the second direction D2. As shown in FIGS. 5 and 6, the above-described insertion hole 21a is formed in the front surface portion 21, and the insertion hole 21a penetrates in the first direction D1. The insertion hole 21a has, for example, a rectangular shape extending in the second direction D2. As an example, the front surface portion 21 includes two insertion holes 21a, and 12 adapters 11 (six double adapters) are inserted into each of the two insertion holes 21a. A notch portion 21e for use in determining the left-right direction (second direction) of the first panel 20 is formed on each insertion hole 21a. The notch portion 21e need not necessarily be formed on any portion of each insertion hole 21a in the left-right direction (second direction D2), and may be formed on any portion in the up-down direction (third direction D3). Note that when the notch portion 21e is formed on each of the plurality of insertion holes 21a, it is preferable to align the notch portions 21e in the same direction.

The protruding portions 21c of the front surface portion 21 each include a through hole 21d through which the above-described nylatch 2 is inserted, and the through hole 21d penetrates in the first direction D1. The first bent portion 22 includes a pair of first side surface portions 23 extending from both ends of the front surface portion 21 in the left-right direction toward the rear side of the rack, a bottom surface portion 24 extending from a lower end of the front surface portion 21 toward the rear side of the rack, and a pair of second side surface portions 25 extending upward (third direction D3) from both ends of the bottom surface portion 24 in the left-right direction.

The first side surface portion 23 extends in the first direction D1 below the protruding portions 21c. The first side surface portion 23 has, for example, a rectangular plate shape and includes a screw hole 23a penetrating in the second direction D2. The above-described screw N1 is inserted into the screw hole 23a from the outside of the first side surface portion 23 in the second direction D2. The bottom surface portion 24 extends from the lower end of the front surface portion 21 in the first direction D1, for example. For example, the length of the bottom surface portion 24 in the first direction D1 is about twice the length of the first side surface portion 23 in the first direction D1.

The bottom surface portion 24 is a portion facing the second panel 30 from below, and has a rectangular shape, for example. The second side surface portion 25 is provided behind the first side surface portion 23 of the bottom surface portion 24 (adjacent to the rear side of the rack). The second side surface portion 25 is bent in the third direction D3 (upward) from both the ends of the bottom surface portion 24 in the second direction D2. The second side surface portion 25 includes a rear portion 25*a* located behind the first side surface portion 23 and a front portion 25*b* extending forward (toward the front side of the rack) from the rear portion 25*a* and located above the first side surface portion 23.

For example, the rear portion 25*a* has a rectangular shape vertically extending in the third direction D3, and the front portion 25*b* has a rectangular shape extending forward from the upper side of the rear portion 25*a*. For example, the first side surface portion 23 and the second side surface portion 25 are substantially the same in position in the second direction D2. The second side surface portion 25 may be flush with the first side surface portion 23.

For example, a cutout portion 26 is provided between the first side surface portion 23 and the second side surface portion 25. The cutout portion 26 includes a first cutout portion 26*a* located between the front portion 25*b* and the front surface portion 21, a second cutout portion 26*b* located between the front portion 25*b* and the first side surface portion 23, and a third cutout portion 26*c* located between the rear portion 25*a* and the first side surface portion 23. The first cutout portion 26*a*, the second cutout portion 26*b*, and the third cutout portion 26*c* continuous in this order. The first cutout portion 26*a* extends downward on the rear side of the front surface portion 21, the second cutout portion 26*b* extends rearward from the lower end of the first cutout portion 26*a*, and the third cutout portion 26*c* extends from the rear end of the second cutout portion 26*b* to the bottom surface portion 24.

The front portion 25*b* of the second side surface portion 25 includes a screw hole 25*d* penetrating in the second direction D2. The above-described screw N1 is inserted into the screw hole 25*d* from the outside of the second side surface portion 25 in the second direction D2. The screw hole 25*d* is provided above the above-described screw hole 23*a* of the first side surface portion 23, and, for example, the screw hole 23*a* and the screw hole 25*d* are arranged in the third direction D3. Screwing the screws N1 through the screw hole 23*a* and the screw hole 25*d* into the above-described screw holes 32*a* of the second bent portion 32 causes the first panel 20 and the second panel 30 to be anchored to each other.

Figure 7:
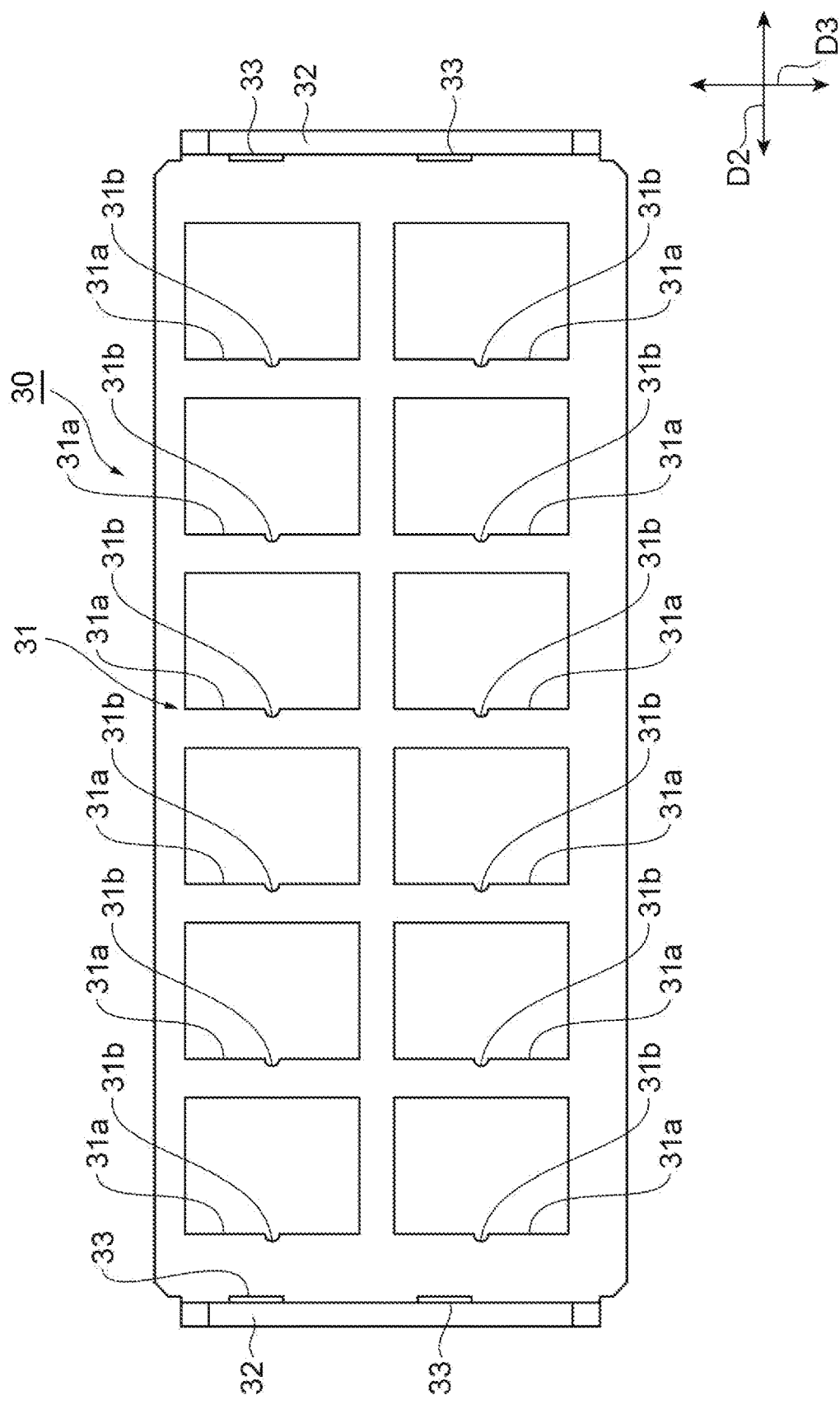
FIG. 7 is a front view of a second panel of the adapter mounting structure shown in FIG. 3.
Figure 8:
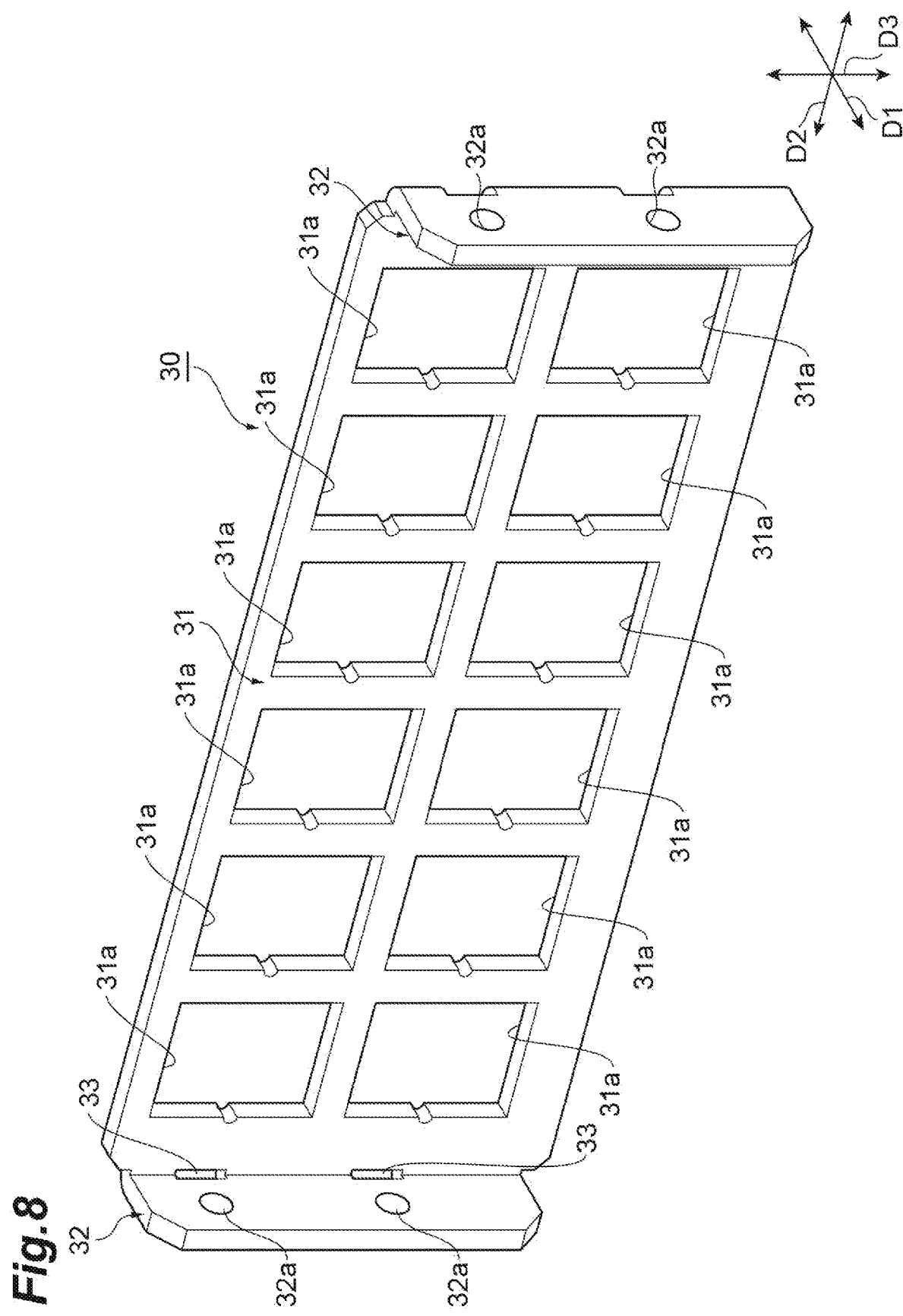
FIG. 8 is a perspective view of the second panel shown in FIG. 7.

FIG. 7 is a front view of the second panel 30 as viewed from front (the front side of the rack). FIG. 8 is a perspective view of the second panel 30. As shown in FIGS. 7 and 8, the main body portion 31 includes, for example, a plurality of insertion holes 31*a* that penetrate in the first direction D1 and through which the adapters 11 are inserted in the first direction D1. As an example, the main body portion 31 includes 12 insertion holes 31*a* (two rows of six holes) through which each pair of the adapters 11 (double adapters) vertically aligned is inserted. Each insertion hole 31*a* has, for example, a rectangular shape. On each insertion hole 31*a*, a notch portion 31*b* for use in determining the left-right direction of the second panel 30 may be formed. The notch portion 31*b* need not necessarily be formed on any portion of the insertion hole 31*a* in the left-right direction (second direction D2), and may be formed on any portion in the up-down direction (third direction D3). Note that when the notch portion 31*b* is formed on each of the plurality of insertion holes 31*a*, it is preferable to align the notch portions 31*b* in the same direction.

A slit portion 33 extending in the third direction D3 is formed between the second bent portion 32 and the main body portion 31. For example, a pair of the slit portions 33 are provided on both the ends of the main body portion 31 in the second direction D2. Each slit portion 33 extends in the third direction D3. When the second bent portion 32 is formed by bending, making the second bent portion 32 flexible along the slit portion 33 makes it possible to prevent deformation in the screw hole 32*a* located in the vicinity of the bent portion. The pair of screw holes 32*a* aligned in the third direction D3 in the second bent portion 32 are provided corresponding to the above-described screw hole 25*d* and screw hole 23*a*.

Specifically, in the first direction D1 and the third direction D3, the upper screw hole 32*a* coincides in position with the screw hole 25*d* of the second side surface portion 25, and the lower screw hole 32*a* coincides in position with the screw hole 23*a* of the first side surface portion 23. As a result, the screw N1 is screwed into the screw hole 25*d* and the screw hole 32*a* with the screw hole 25*d* located outside the upper screw hole 32*a* in the second direction D2. Then, screwing, with the screw hole 23*a* located outside the lower screw hole 32*a* in the second direction D2, the screw N1 into the screw hole 23*a* and the screw hole 32*a* causes the first panel 20 and the second panel 30 to be anchored to each other.

Next, a description will be given in detail of the action and effect of the above-described adapter mounting structure 10 according to the first embodiment. For example, as shown in FIG. 3, the adapter mounting structure 10 includes the first panel 20 anchored to the rack and configured to expose the adapters, and the second panel 30 anchored to the first panel 20 and configured to anchor the adapters 11. The adapter mounting structure 10 includes the first panel 20 located adjacent to the front side of the rack and the second panel 30 located adjacent to the rear side of the rack, and each of the plurality of adapters 11 is mounted on the two panels integrated into a single panel.

Therefore, the use of such two panels, the first panel 20 and the second panel 30, integrated into a single panel makes it possible to increase strength and in turn makes it possible to suppress deformation in the panels.

Each of the plurality of adapters 11 is exposed from the first panel 20 to the front side of the rack and is anchored to the second panel 30 located to the rear side of the rack relative to the first panel 20. Therefore, anchoring each adapter 11 to the second panel 30 located to the rear side of the rack makes it possible to reduce the protrusion amount of the adapter 11 from the first panel 20. For example, even when the adapter mounting structure 10 has the identification numbers X1 to X8 for use in identifying each adapter 11, the reduction in the protrusion amount of each adapter 11 makes the identification numbers X1 to X8 clearly visible.

The first panel 20 may include the first bent portion 22 bent toward the rear side of the rack. This structure where the first panel 20 includes the first bent portion 22 bent toward the rear side of the rack can increase strength of the first panel 20. It is therefore possible to more reliably suppress deformation in the first panel 20 caused by the connection of the optical connectors to the adapters 11 or the like.

The second panel 30 may include the second bent portion 32 bent along the first bent portion 22. This structure where the second panel 30 configured to anchor the plurality of adapters 11 includes the second bent portion 32 can increase strength of the second panel 30. It is therefore possible to more reliably suppress deformation in the second panel 30 caused by the application of an external force to the adapters 11.

The first panel 20 may include the front surface portion 21 that exposes the adapters 11. The first bent portion 22 may include the pair of first side surface portions 23 extending from both the ends of the front surface portion 21 in the left-right direction toward the rear side of the rack, and the bottom surface portion 24 extending from the lower end of the front surface portion 21 toward the rear side of the rack. This structure where the first bent portion 22 includes the pair of the first side surface portion 23 and the bottom surface portion 24 can further increase the strength of the first panel 20. This in turn makes it possible to more reliably suppress deformation in the first panel 20.

The first bent portion 22 may further include the pair of second side surface portions 25 extending upward from both the ends of the bottom surface portion 24 in the left-right direction. This structure where the first bent portion 22 further includes the second side surface portions 25 can more reliably suppress deformation caused by the connection of the optical connectors or the like.

The first side surface portions 23 and the second side surface portions 25 may be each screwed to the second panel 30. This structure where the first side surface portions 23 and second side surface portions 25 of the first panel 20 are each screwed to the second panel 30 allows the first panel 20 and the second panel 30 to be anchored to each other more tightly, and can eliminate the need of sheet-metal welding or the like between the first panel 20 and the second panel 30. That is, the first panel 20 and the second panel 30 can be tightly anchored to each other by screwing, thereby making it possible to eliminate the need of anchoring by sheet-metal welding or the like. It is therefore possible to eliminate the cost of sheet-metal welding or the like and to enhance finished appearances of the first panel 20 and the second panel 30.

Second Embodiment

Figure 9:
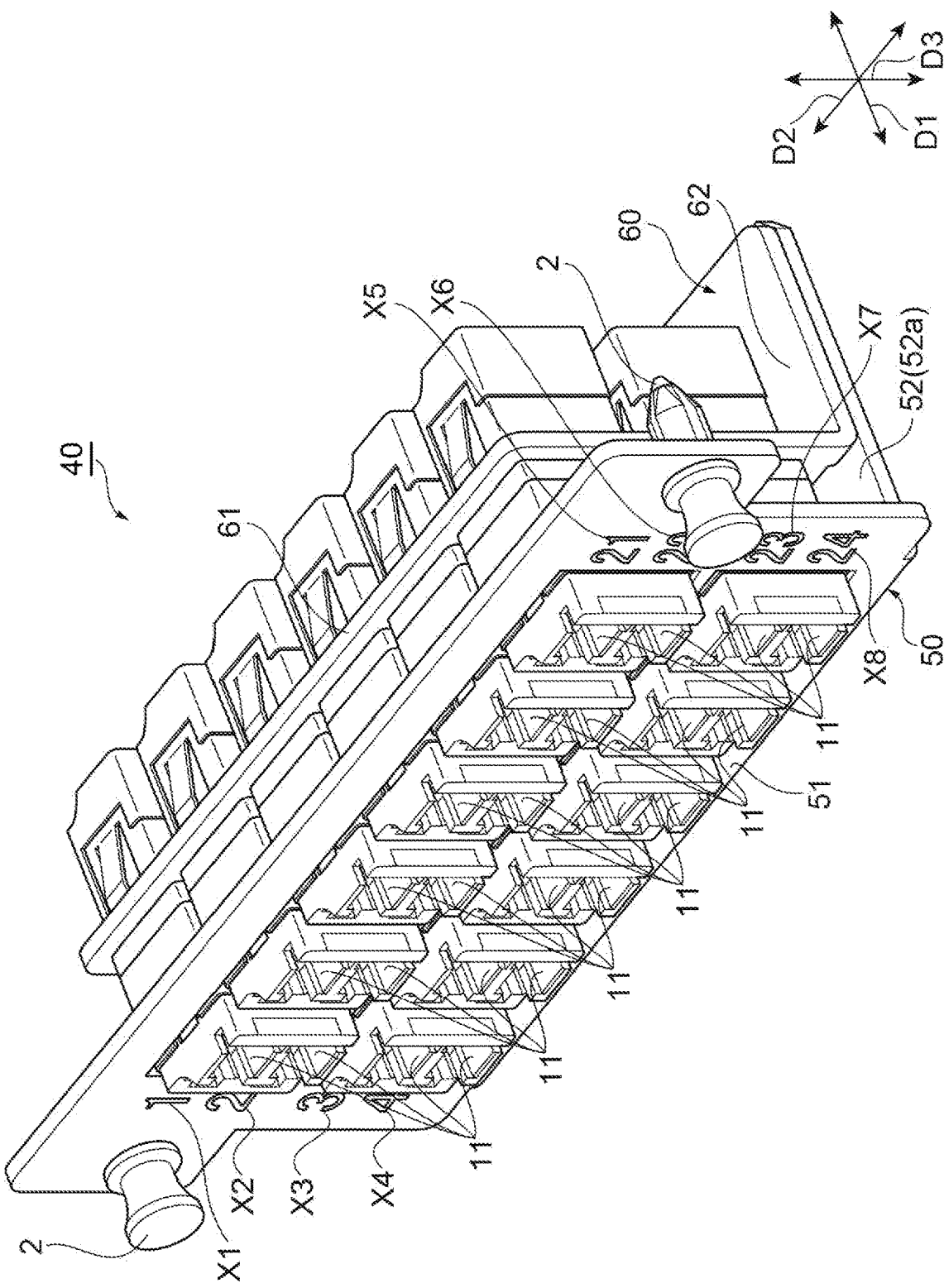
FIG. 9 is a perspective view of an adapter mounting structure according to the second embodiment.
Figure 10:
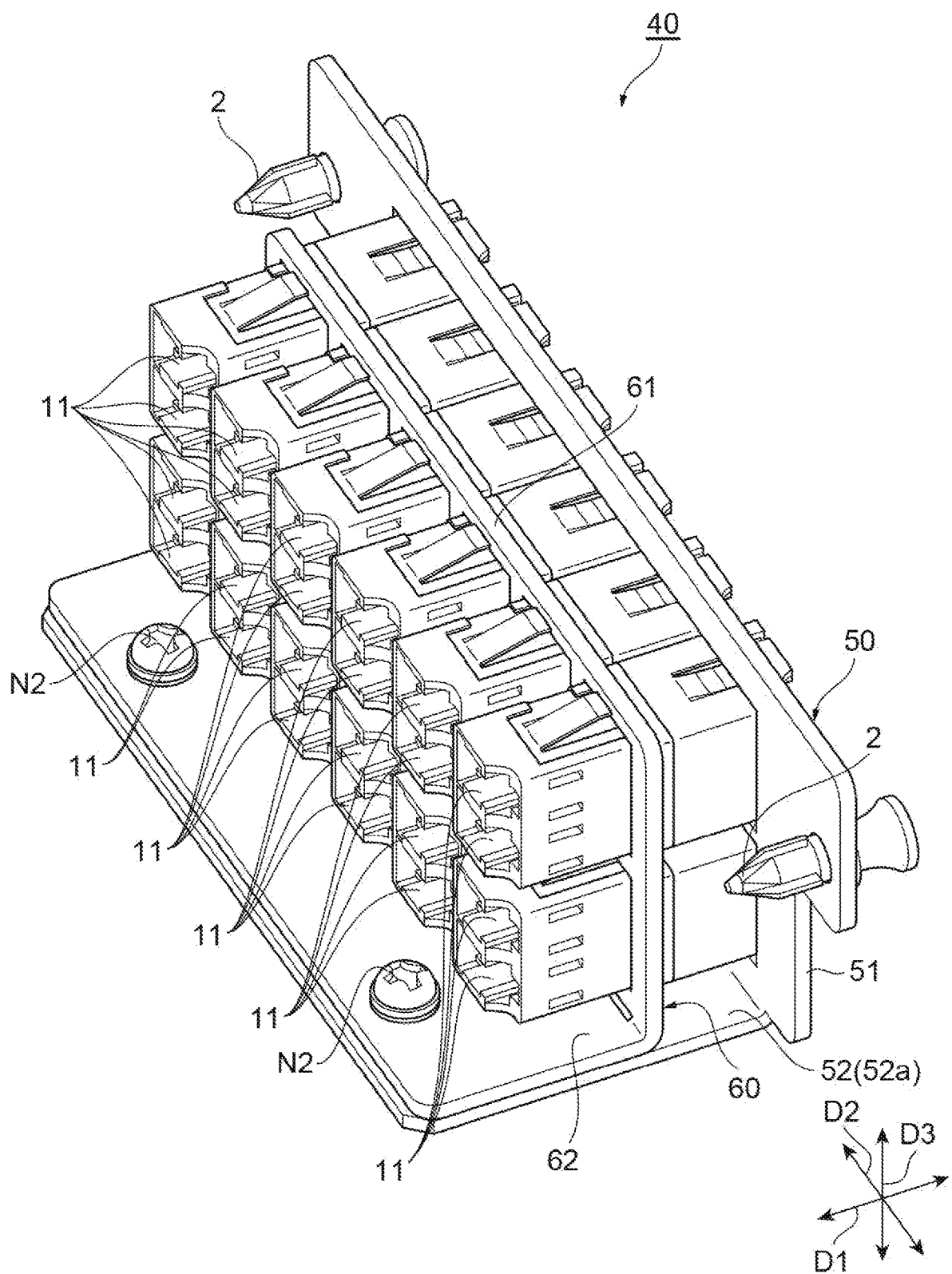
FIG. 10 is a perspective view of the adapter mounting structure shown in FIG. 9 as viewed in a direction different from the direction in FIG. 9.

Next, a description will be given of an adapter mounting structure 40 according to the second embodiment with reference to FIGS. 9 and 10. As shown in FIGS. 9 and 10, the adapter mounting structure 40 includes a first panel 50 and a second panel 60 that are different in shape from the first panel 20 and the second panel 30, respectively. In the following description, any redundant description that has been already given for the first embodiment will be omitted as appropriate.

The first panel 50 includes, for example, a front surface portion 51 similar to the front surface portion 21, and a first bent portion 52 bent from a lower end of the front surface portion 51 toward the rear side of the rack. The second panel 60 includes a main body portion 61 similar to the main body portion 31 to which each adapter 11 is anchored, and a second bent portion 62 bent from a lower end of the main body portion 61 toward the rear side of the rack. Both the first bent portion 52 and the second bent portion 62 extend, farther than the adapters 11, toward the rear side of the rack, and the second bent portion 62 is placed on an upper surface 52a of the first bent portion 52.

The first bent portion 52 and the second bent portion 62 each have a screw hole into which a screw N2 is screwed. Screwing the screw N2 into the screw hole of the first bent portion 52 and the screw hole of the second bent portion 62 causes the first panel 50 and the second panel 60 to be anchored to each other. For example, the first bent portion 52 and the second bent portion 62 are anchored to each other with a pair of screws N2 aligned in the second direction D2. As an example, the pair of screws N2 are provided at positions equally spaced apart from a center of the adapter mounting structure 40 in the second direction D2.

As described above, in the adapter mounting structure 40 according to the second embodiment, since each of the plurality of adapters 11 is mounted on the two panels (the first panel 50 and the second panel 60) integrated into a single panel, it is possible to suppress deformation in the panels. Further, anchoring each adapter 11 to the second panel 60 located to the rear side of the rack makes it possible to reduce the protrusion amount of the adapter 11 from the first panel 50. Accordingly, this makes the identification numbers X1 to X8 clearly visible.

The first panel 50 may include the first bent portion 52 bent toward the rear side of the rack. This makes it possible to increase strength of the first panel 50, and to more reliably suppress deformation in the first panel 50 caused by the connection of the optical connectors to the adapters 11 or the like. The second panel 60 may include the second bent portion 62 bent toward the rear side of the rack. This makes it possible to increase strength of the second panel 60, and to more reliably suppress deformation in the second panel 60 caused by the application of an external force to the adapters 11.

The embodiments of the adapter mounting structure according to the present disclosure have been described above. However, the present invention is not limited to the above-described embodiments and the above-described examples, and various modifications can be made without departing from the gist described in the claims. That is, the shape, size, and arrangement mode of each portion of the first panel and second panel of the adapter mounting structure can be changed as appropriate without departing from the above gist.

For example, in the above-described embodiment, the adapter mounting structure 10 provided in the module 1 has been described. However, the shape, size, and mounting mode to the rack of the module to which the adapter mounting structure is mounted are not limited to the shape, size, and mounting mode of the above-described module 1, and can be changed as appropriate. That is, the adapter mounting structure 10 can be used as an adapter panel that is not provided on the module 1 but is anchored alone to a rack or the like. Further, in the above-described embodiment, the module 1 that is an MPO cassette module in which each single-core LC connector and a multi-core MPO connector are optically connected to each other has been described. However, the standard on the optical connectors to which the module is connected is not limited to LC or MPO and can be changed as appropriate.

REFERENCE SIGNS LIST 1 module
2 nylatch
3 adapter
10, 40 adapter mounting structure 11 adapter
11a leaf spring
20, 50 first panel
21, 51 front surface portion
21a insertion hole
21b main body portion
21c protruding portion
21d through hole
21e notch portion
22, 52 first bent portion
23 first side surface portion
23a screw hole
24 bottom surface portion
25 second side surface portion
25a rear portion
25b front portion
25d screw hole
26 cutout portion
26a first cutout portion
26b second cutout portion
26c third cutout portion
30, 60 second panel
31, 61 main body portion
31a insertion hole
31b notch portion
32, 62 second bent portion
32a screw hole
33 slit portion
52a upper surface
D1 first direction
D2 second direction
D3 third direction
N1, N2 screw
X1, X2, X3, X4, X5, X6, X7, X8 identification number.

The invention claimed is:

1. An adapter mounting structure for mounting, on a rack, a plurality of adapters to which optical connectors are connected, the adapter mounting structure comprising:
    a first panel including insertion holes through which the plurality of adapters are inserted, the first panel being configured to expose, to a front side of the rack, the plurality of adapters inserted and being anchored to the rack; and
    a second panel disposed to a rear side of the rack relative to the first panel, the second panel being anchored to the first panel and being configured to anchor each of the plurality of adapters, wherein
    the first panel includes a first bent portion bent toward the rear side of the rack.

2. The adapter mounting structure according to claim 1, wherein
    the second panel includes a second bent portion bent along the first bent portion.

3. The adapter mounting structure according to claim 2, wherein
    the second bent portion is a portion bent in a direction opposite to the direction in which the first bent portion extends.

4. The adapter mounting structure according to claim 2, wherein
    the first panel includes a front surface portion configured to expose the adapters, and
    the first bent portion includes a pair of first side surface portions extending from both ends of the front surface portion in a left-right direction toward the rear side of the rack, and a bottom surface portion extending from a lower end of the front surface portion toward the rear side of the rack.

5. The adapter mounting structure according to claim 1, wherein
    the first panel includes a front surface portion configured to expose the adapters, and
    the first bent portion includes a pair of first side surface portions extending from both ends of the front surface portion in a left-right direction toward the rear side of the rack, and a bottom surface portion extending from a lower end of the front surface portion toward the rear side of the rack.

6. The adapter mounting structure according to claim 5, wherein
    the first bent portion further includes a pair of second side surface portions extending upward from both ends of the bottom surface portion in the left-right direction.

7. The adapter mounting structure according to claim 6, wherein
    the first side surface portions and the second side surface portions are each screwed to the second panel.

8. The adapter mounting structure according to claim 6, wherein
    a cutout portion is provided between the first side surface portion and the second side surface portion.

9. The adapter mounting structure according to claim 6, wherein
    the second side surface portion includes a rear portion located behind the first side surface portion and a front portion extending toward the front side of the rack from the rear portion and located above the first side surface portion.

10. The adapter mounting structure according to claim 5, wherein
    identification numbers for use in identifying each of the plurality of adapters are printed on the front surface portion.

11. The adapter mounting structure according to claim 5, wherein
    the front surface portion includes a main body portion having insertion holes that expose the plurality of adapters, and a pair of protruding portions extending outward from the main body portion.

12. The adapter mounting structure according to claim 11, wherein
    the protruding portions of the front surface portion each include a through hole through which a nylatch is inserted.

13. The adapter mounting structure according to claim 5, wherein
    the bottom surface portion is a portion facing the second panel from below.

14. An adapter mounting structure for mounting, on a rack, a plurality of adapters to which optical connectors are connected, the adapter mounting structure comprising:
    a first panel including insertion holes through which the plurality of adapters are inserted, the first panel being configured to expose, to a front side of the rack, the plurality of adapters inserted and being anchored to the rack; and
    a second panel disposed to a rear side of the rack relative to the first panel, the second panel being anchored to the first panel and being configured to anchor each of the plurality of adapters, wherein
    the adapter mounting structure is provided at one end of a module in a first direction, and an adapter is provided at the other end of the module in the first direction.

15. The adapter mounting structure according to claim 14, wherein
the adapter is an MPO adapter to which an MPO connector is connected.

16. The adapter mounting structure according to claim 14, wherein
the module is an MPO cassette that allows a plug-and-play connection between the MPO connector and each single-core connector.

17. An adapter mounting structure for mounting, on a rack, a plurality of adapters to which optical connectors are connected, the adapter mounting structure comprising:
a first panel including insertion holes through which the plurality of adapters are inserted, the first panel being configured to expose, to a front side of the rack, the plurality of adapters inserted and being anchored to the rack; and
a second panel disposed to a rear side of the rack relative to the first panel, the second panel being anchored to the first panel and being configured to anchor each of the plurality of adapters, wherein
the second panel is placed in a space defined by a front surface portion and each first bent portion of the first panel.

18. An adapter mounting structure for mounting, on a rack, a plurality of adapters to which optical connectors are connected, the adapter mounting structure comprising:
a first panel including insertion holes through which the plurality of adapters are inserted, the first panel being configured to expose, to a front side of the rack, the plurality of adapters inserted and being anchored to the rack; and
a second panel disposed to a rear side of the rack relative to the first panel, the second panel being anchored to the first panel and being configured to anchor each of the plurality of adapters, wherein
a leaf spring is provided on each adapter, and
when each adapter is pressed against the second panel, the leaf spring is expanded upward to be caught on the second panel.

19. An adapter mounting structure for mounting, on a rack, a plurality of adapters to which optical connectors are connected, the adapter mounting structure comprising:
a first panel including insertion holes through which the plurality of adapters are inserted, the first panel being configured to expose, to a front side of the rack, the plurality of adapters inserted and being anchored to the rack; and
a second panel disposed to a rear side of the rack relative to the first panel, the second panel being anchored to the first panel and being configured to anchor each of the plurality of adapters, wherein
a notch portion for use in determining the direction of the first panel is formed on each insertion hole.

20. An adapter mounting structure for mounting, on a rack, a plurality of adapters to which optical connectors are connected, the adapter mounting structure comprising:
a first panel including insertion holes through which the plurality of adapters are inserted, the first panel being configured to expose, to a front side of the rack, the plurality of adapters inserted and being anchored to the rack; and
a second panel disposed to a rear side of the rack relative to the first panel, the second panel being anchored to the first panel and being configured to anchor each of the plurality of adapters, wherein
the second panel includes a plurality of insertion holes through which the adapters are inserted.

* * * * *